United States Patent [19]

Chemla et al.

[11] Patent Number: 4,525,687
[45] Date of Patent: Jun. 25, 1985

[54] HIGH SPEED LIGHT MODULATOR USING MULTIPLE QUANTUM WELL STRUCTURES

[75] Inventors: Daniel S. Chemla, Rumson; Theodoor C. Damen, Colts Neck; Arthur C. Gossard, Warren; David A. B. Miller, Lincroft; Thomas H. Wood, Highlands, all of N.J.

[73] Assignee: AT&T Bell Laboratories, Murray Hill, N.J.

[21] Appl. No.: 558,545

[22] Filed: Dec. 2, 1983

Related U.S. Application Data

[63] Continuation-in-part of Ser. No. 470,329, Feb. 28, 1983, abandoned.

[51] Int. Cl.$^3$ .................... H01L 33/02; G02B 5/14
[52] U.S. Cl. ...................... 332/7.51; 357/16; 357/17
[58] Field of Search ............ 332/7.51; 372/43; 357/16, 17, 19; 29/572

[56] References Cited

U.S. PATENT DOCUMENTS

| | | | |
|---|---|---|---|
| 3,611,207 | 1/1970 | Klahr | 332/7.51 |
| 3,791,717 | 2/1974 | Honda | 350/160 |
| 3,982,207 | 9/1976 | Dingle et al. | 331/94.5 |
| 3,982,267 | 9/1976 | Henry | 357/52 |
| 3,991,383 | 8/1976 | Hughes et al. | |
| 4,080,617 | 3/1978 | Dyment | 357/17 |
| 4,093,345 | 6/1978 | Logan et al. | 350/355 |
| 4,114,257 | 9/1978 | Bellavonce | |
| 4,145,121 | 3/1979 | Hata et al. | 350/355 |
| 4,205,329 | 5/1980 | Dingle et al. | 357/16 |
| 4,208,667 | 6/1980 | Chang et al. | 357/16 |
| 4,261,771 | 4/1981 | Dingle et al. | 148/175 |
| 4,352,116 | 9/1982 | Yariv et al. | 357/17 |
| 4,365,260 | 12/1982 | Halonyak | 357/17 |
| 4,383,269 | 5/1983 | Capasso | 357/16 |
| 4,385,309 | 5/1983 | Quisser et al. | 357/16 |
| 4,398,963 | 8/1983 | Stall et al. | 357/16 |

OTHER PUBLICATIONS

F. Capasso et al., "Enhancement of Electron Impactionization in a Superlattice: a New Avalanche Photodiode with a Large Ionization Rate Rate Ratio", *Applied Physics Letters* 40(1), Jan. 1, 1982, pp. 38–40.

Lee et al., "InGaAs/InP PIN Punch-Through Photodiodes", *Electronics Letters*, vol. 17, No. 12, Jun. 11, 1981, pp. 431–432.

K. Ahmad et al., "Gallium Indium Arsenide Photodiodes", *Solid State Electronics*, vol. 22, 1979, pp. 327–333.

J. Applied Physics, vol. 53, No. 10, Oct. 1982, p. R150-J. S. Blakemore.

Applied Physics Letters, vol. 41, Oct. 1982, p. 679-- Miller et al.

Applied Physics Letters, vol. 41, Sep. 1982, p. 476-Olego et al.

*Primary Examiner*—Nelson Moskowitz
*Attorney, Agent, or Firm*—Gregory C. Ranieri

[57] ABSTRACT

A semiconductor apparatus is provided. The apparatus has a multiple layer heterostructure having first and second material layers having first and second bandgaps, respectively and a semiconductor layer of a third bandgap being fabricated between said material layers, the bottom of the conduction band of said semiconductor layer is below the bottom of the conduction band of said material layers, and the top of the valence band of said semiconductor layer is above the top of the valence band of said material layers, the thickness of said semiconductor layer is chosen sufficient for carrier confinement effects within said semiconductor layer to influence the optical properties of said multiple layer heterostructure, and means for applying an electric field to the multiple layer heterostructure in order to vary an optical absorption coefficient and an index of refraction of the multiple layer heterostructure in response to the electric field. The apparatus is adapted for use as an optical absorption modulator or optical phase modulator, or as an electrically tuned Fabry-Perot cavity or as a polarization modulator, or as a nonlinear or bistable apparatus in which the operating point is varied by application of an electric field.

25 Claims, 25 Drawing Figures

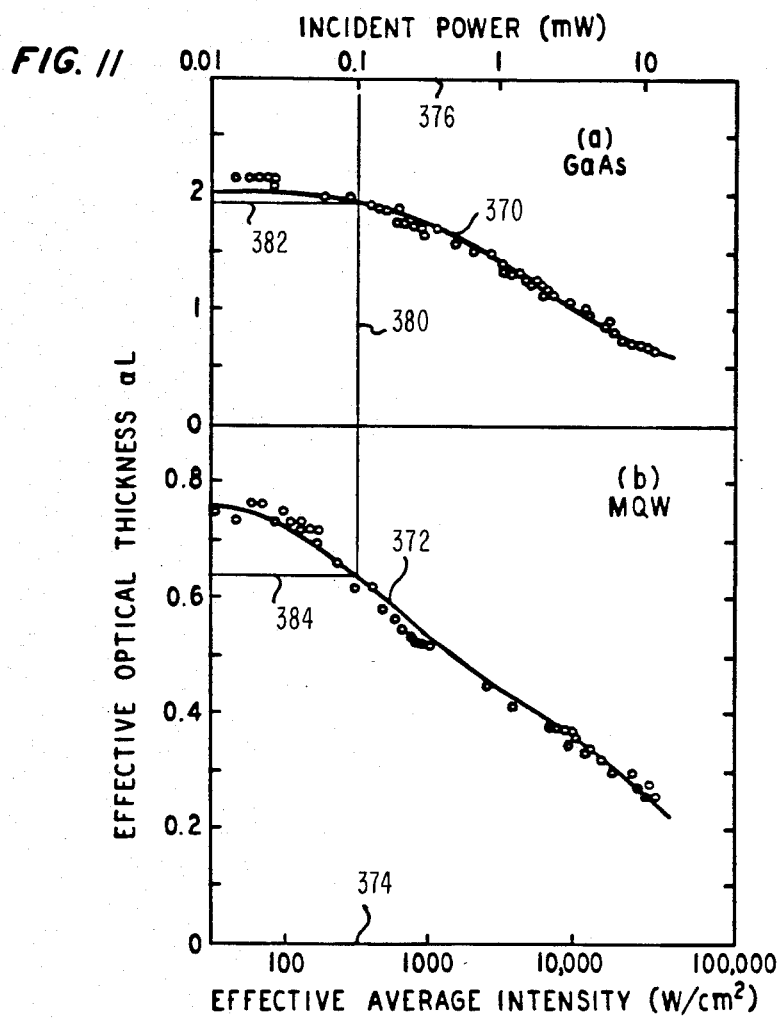

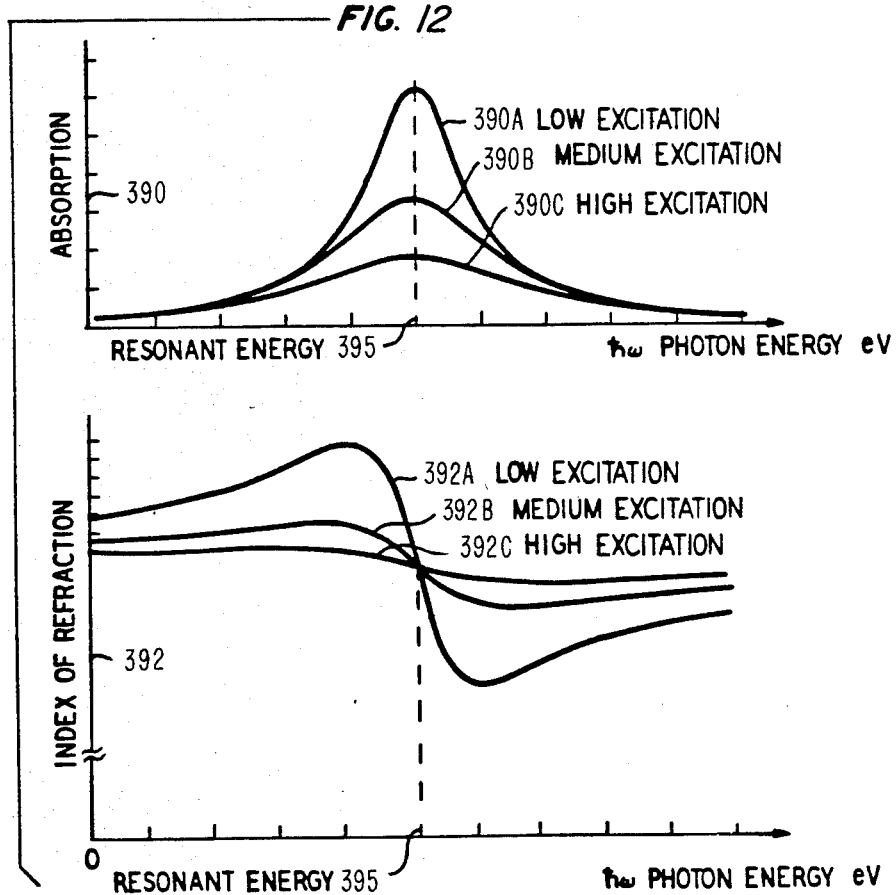

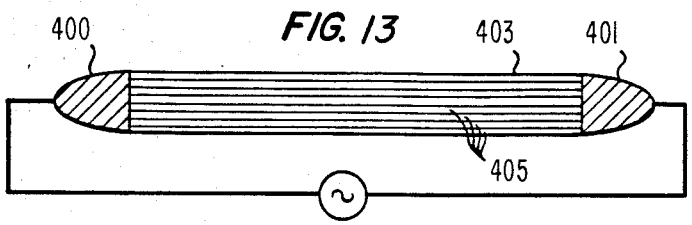
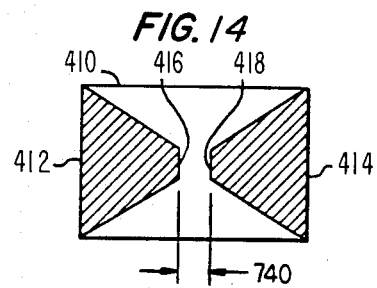
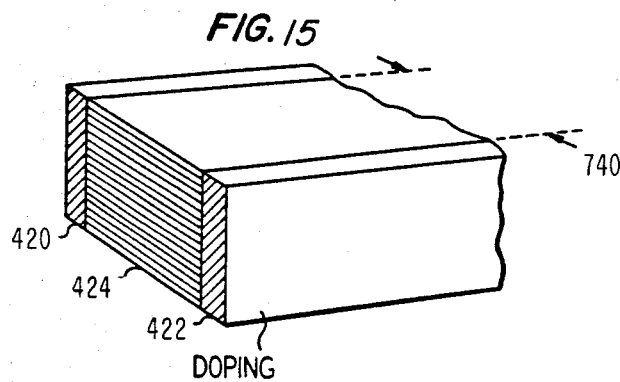

PIN CONTACT MODULATOR

CONTROLLED FABRY PEROT CAVITY

CONTROLLED FABRY PEROT CAVITY

POLARIZATION MODULATOR

HIGH SPEED LIGHT MODULATOR USING MULTIPLE QUANTUM WELL STRUCTURES

CROSS-REFERENCE TO RELATED APPLICATION

This application is a continuation-in-part of our co-pending application, Ser. No. 470,329, filed Feb. 28, 1983, now abandoned.

BACKGROUND OF THE INVENTION

This invention relates to semiconductor devices for controlling light such as optical modulators and nonlinear optical devices.

Conventional semiconductor optical modulators have traditionally made use of the Franz-Keldysh effect to modulate an incident light beam. According to the Franz-Keldysh effect, the band structure of the semiconductor material is shifted by application of an electric field. However, the Franz-Keldysh effect is characterized by small shifts in optical properties such as absorption and index of refraction thereby limiting the modulation to be correspondingly small. In order to achieve the deep modulation required for a practical device it is necessary to use either a high electric field or a device having long optical path length or both. For example, a modulator described by Honda in U.S. Pat. No. 3,791,717 issued Feb. 12, 1974 uses a high electric field ($10^5$ to $10^6$ volts per centimeter) in a semiconductor having a crystal of long optical pathlength (10 microns).

An optical modulator which uses a heterojunction semiconductor device in which optical absorption and reemission are controlled by an electric field is described by Chang et al in U.S. Pat. No. 4,208,667. Chang et al uses a heterojunction superlattice having two different material arrangements alternatively to form a semiconductor heterojunction in which the bottom of the conduction band of a first layer is lower than the conduction band in the second layer, and also the top of the valence band is lower than the corresponding band in the second layer. This device and superlattice allows electrons and holes to be excited by photoabsorption wherein the electrons collect in one layer and holes in the adjacent layer. Charge carriers recombine by making a transition into the adjacent layer with the subsequent emission of light. The rate of recombination is controlled by an electric field applied to the superlattice. It is a property of the Chang et. al. device that the emitted light is of a different frequency from the incident light and that the light is emitted in all directions. In should also be noted that the incident and emitted light beams are not collinear through the devices. As a result, the Chang et al device is impractical as an optical modulator.

Nonlinear optical devices have been made using heterojunction semiconductor materials. These devices are characterized by an operating point determined by optical cavity gain or finesse. These nonlinear optical devices exhibit particular aspects such as bistability, amplification, photonic modulation or the like. A problem with this type of nonlinear optical device is that the operating point is selected by the choice of materials and other design parameters during fabrication of the device. Therefore, the operating point cannot be conveniently controlled at the time the device is in use.

SUMMARY OF THE INVENTION

In accordance with the present invention, the foregoing problems are solved by employing a semiconductor apparatus comprising a multiple layer heterostructure and means for applying an electric field to the multiple layer heterostructure in order to vary optical absorption coefficients and an index refraction of the multiple layer heterostructure in response to the electric field. The multiple layer heterostructure includes first and second material layers having first and second bandgaps, respectively, and a semiconductor layer having a third bandgap and is being positioned between the wider bandgap layers. The bottom of the conduction band of the first semiconductor layer is below the bottom of the conduction bands of the first and second material layers. The top of the valence band of the first semiconductor layer is above the top of the valence band of the first and second material layers. The thickness of the first semiconductor layer is 1000 Angstroms or less. The semiconductor apparatus is adapted for use as an optical absorption modulator, or an optical phase modulator or an optical polarization modulator. By interposing the apparatus between mirrors, the resulting apparatus is an electrically tuned Fabry-Perot cavity. The apparatus is also adapted for other nonlinear or bistable applications in which modification of the optical properties of a semiconductor by application of an electric field is useful. In one embodiment the electric field is conveniently applied by fabricating the multiple layer heterostructure as the intrinsic region of a PIN semiconductor structure.

BRIEF DESCRIPTION OF THE DRAWING

FIG. 11 is a graph showing saturation of optical absorption versus intensity of illumination for a MQW structure;

FIG. 12 is a graph showing the relationship between optical absorption and index of refraction as predicted by the Kramers-Kronig relationship as the optical absorption saturates under a high intensity;

FIG. 13 is a cross-sectional drawing showing an alternate arrangement of electrodes for applying an electric field to a MQW structure;

FIG. 14 is a top view showing an alternate arrangement of electrodes for applying an electric field to a MQW structure;

FIG. 15 is a perspective drawing showing an alternate arrangement of electrodes for applying an electric field to a MQW structure;

DESCRIPTION OF THE PREFERRED EMBODIMENT

Figure 1:
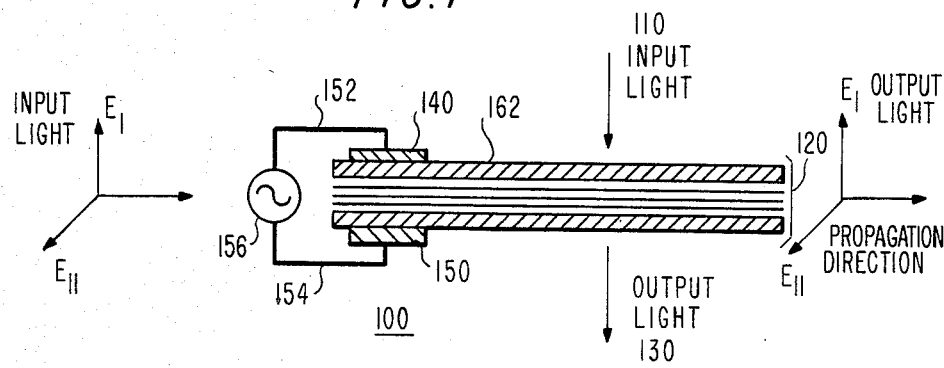
FIG. 1 is a cross-sectional drawing of a MQW with an electric potential applied perpendicular to the layer planes.

In FIG. 1 there is shown an exemplary light modulator 100. A source (not shown) produces unmodulated light 110. The source may be, for example, a laser. Also, for example, the source may be a light emitting diode. Other light sources such as light transmitted by an optical fiber may conveniently be employed to produce unmodulated input light 110. Unmodulated input light 110 passes through multiple quantum well (MQW) structure 120, after which it is output modulated light 130. A MQW structure 120 includes both a structure with one quantum well or structures with many quantum wells. First electrical contact 140 and second electrical contact 150 are connected by electrical conductors 152, 154 to source 156 of electric potential. An electric field is applied to MQW structure 120 by the potential provided by source 156 through electrical contacts 140 and 150. Source 156 may, for example, be a direct current source, such as a battery. Or, for example, source 156 may be a klystron oscillator operating at a multiple gigahertz frequency. For example, source 156 may provide electric potential in the 100 gigahertz frequency range. Application of an electric field to MQW structure 120 causes the optical transmission of MQW structure 120 to vary with the applied potential. The optical transmission of MQW 120 may either increase or decrease with applied electric field, depending upon the light frequency at which the transmission is considered, as will be more fully explained hereinafter. In the alternative embodiment shown in FIG. 1, electrical contacts 140, 150 are attached to transparent or partially transparent electrodes 160, 162 which, for example, can be semiconductor layers doped to be conductive, or, for example, can be thin metallic layers. Contacts 140, 150 are attached so that an electrical potential applied between them is conducted by electrodes 160, 162 and therefore produces an electric field which is substantially perpendicular to layer planes 164 of MQW 120. For example, electrodes made of AlGaAs are satisfactory for a MQW 120 made of AlGaAs and GaAs layers. For example, electrodes 160, 162 may be mae of Al, Cr, Au, Ag or alloys of these metals or combinations of layers of these metals, and with thicknesses between 0.05 micron and 0.1 micron. Also, for example, indium tin oxide electrodes may be used.

In an embodiment which uses partially transparent electrodes, it is convenient to choose their thickness to achieve antireflection properties. Such a choice is given by the equation $$T = \frac{\lambda}{4n} (2p - 1)$$

where T is the electrode thickness, n is the index of refraction of the electrodes, $\lambda$ is the wavelength of the light being modulated, and p is an integer, p=1, 2, 3, . . . etc. For example, for electrodes made of indium tin oxide which has an index of refraction n of approximately 1.8, and the use of GaAs/AlGaAs MQW structure operating at $\lambda=0.85$ micron, the thickness is given as:

| p | T micron |
|---|---|
| 1 | 0.12 |
| 2 | 0.36 |

The use of the thicker, 0.36 micron layer is more convenient as the thicker layer provides lower contact resistance.

Figure 2:
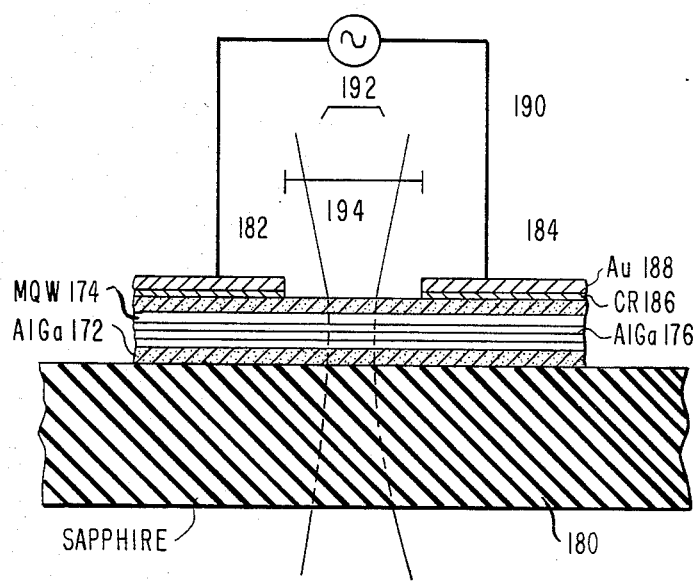
FIG. 2 is a cross-sectional drawing of a MQW with an electric field applied substantially parallel to the layer planes.

In FIG. 2 the MQW modulator 170 used in an exemplary embodiment was fabricated by molecular beam epitaxy on a GaAs substrate (not shown) and which was removed during fabrication. A 1.45 $\mu$m thick $Al_{0.28}Ga_{0.72}As$ cap layer 172 is attached to 65 periods of alternate 96 Å GaAs and 98 Å $Al_{0.28}Ga_{0.72}As$ layers to form the 1.26 $\mu$m thick MQW 174, the capped by a further 1.45 $\mu$m thick $Al_{0.28}Ga_{0.72}As$ layer 176. The cap layers 172, 176 are transparent in the MQW bandgap region. All the materials were undoped with residual carrier concentration less than $\simeq 10^{15}$ cm$^{-3}$. A 3×3 mm$^2$ sample was cleaved along the [110] and [1$\bar{1}$0] directions and glued by the epitaxial cap layer 172, with a transparent epoxy (not shown) to a sapphire support 180. The entire GaAs substrate (not shown) was selectively etched off.

Electrical contacts 182, 184 of 100 Å Cr 186 followed by 1000 Å Au 188 were evaporated on the sample to give an electrode spacing 190 d=300 $\mu$m. A cw tunable oxazine 750 dye laser (not shown) was used as a light source to measure the absorption spectra of MQW structure 170. The light beam 192 was focused to a 50 $\mu$m diameter spot 194 at the center of the interelectrode gap, with a polarization parallel to the electric field. The transmission, as corrected for surface reflection, was measured as a function of the laser frequency for voltages applied between electrical contacts 182 and 184, with the voltage varying from 0 to 650 V. The laser power was kept as low as $\simeq 10$ $\mu$W to avoid carrier generation. The current passing through the sample between electrodes 182 and 184 was 10 $\mu$A at 150 V.

Figure 3:
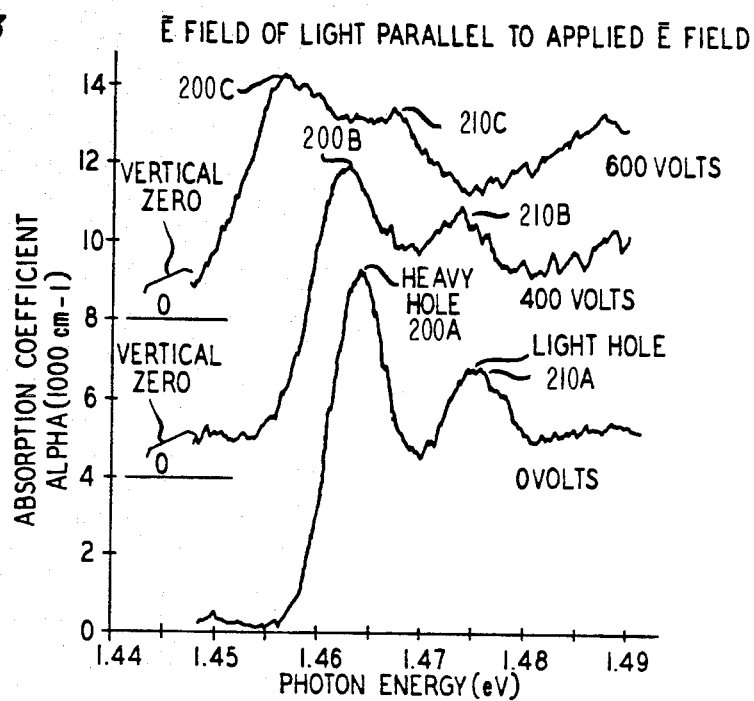
FIG. 3 is representative optical absorption for different applied electric fields for a MQW.

In FIG. 3 there are shown exemplary curves of the absorption coefficient spectra for 0 volt, 400 volts, and 600 volts, as marked. The curves for 400 volts and 600 volts are shifted vertically upward to avoid crossing in FIG. 3. Shifts of the heavy hole exciton shown as peak 200 A at 0 volts, to 200 B at 400 volts, and to 200 C at 600 volts are evident. Also peak 200 A, 200 B, 200 C show a broadening as the voltage is increased. The light hole peak 210 A at 0 volt, 210 B at 400 volts, and 210 C at 600 volts show both a shift and a broadening. The shifts are difficult to measure up to $V \simeq 200$ V because they are small compared to the linewidth; above this value they show a superlinear dependence on V.

Figure 4:
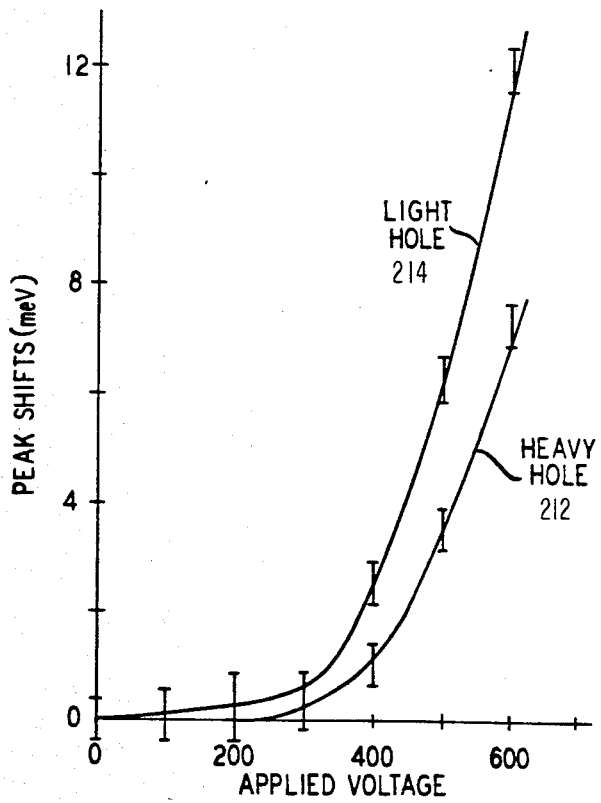
FIG. 4 is a graph showing the shift in exciton peak with applied voltage.

In FIG. 4 the shift of the heavy hole peak (200 A, 200 B, 200 C in FIG. 3) is shown as curve 212. The shift of the light hole peak (210 A, 210 B, 210 C in FIG. 3) is shown as curve 214.

The light hole-excition peak was found to shift more than the heavy hole one. The linewidth could be measured only for the heavy hole-excition; it was taken as the halfwidth at half-maximum on the low energy side of the peak. The width variation is monotonic and approximately linear with the applied field; varying from 2.8 meV at applied voltage=0 V, to 4.3 meV at applied voltage=600 V.

The precise value of the field applied to the MQW is difficult to evaluate because of possible space charge effects and contact resistances. Assuming that the sample behaves like a simple resistor, at the center of the interelectrode spacing one can take $E = \gamma$ V/d, where the correction factor for the present exemplary geometry is $\gamma \simeq 0.8$, as discussed more fully by M. Cardona in the article "Electric Field Modulation," published in *Solid State Physics Supplement* 11, Academic Press, New York, pages 165-275, 1969.

The absorption spectra shown in FIG. 3 for 400 volts corresponds therefore to $E \simeq 10^4$ V/cm, and for 600 volts therefore corresponds to $E \simeq 1.6 \times 10^4$ V/cm. To evaluate the binding energy of the excitons in MQW 96 Å≃thick, we use the experimental and theoretical results of R. C. Miller et. al. as disclosed more fully in their article "Observation of the Excited Level of Excitons in GaAs Quantum Wells," published in *Physical Review*, Vol. B24, p. 1134, in July 1981. Miller et. al. give $E_x(Hh-e) = 9$ meV and $E_x(Lh-e) = 10.5$ meV. The radius can be calculated by the relation; $a_x E_x \simeq$ constant, which gives $a_x(Hh-e) \simeq 65$ Å and $a_x(Lh-e) \simeq 56$ Å. The corresponding ionization fields, $E_I = 1.4 \times 10^4$ V/cm and $E_I = 1.9 \times 10^4$ V/cm, are quite consistent with out measurements. Note that any simple perturbation analysis of our results is invalid because of the high value of the fields, relative to $E_I$, which we utilize. The observation of the larger binding energy of the light hole-exciton and its greater sensitivity to static fields should be interpreted with care, as additional complication may occur due to its proximity to the heavy hole interband continuum.

Figure 5:
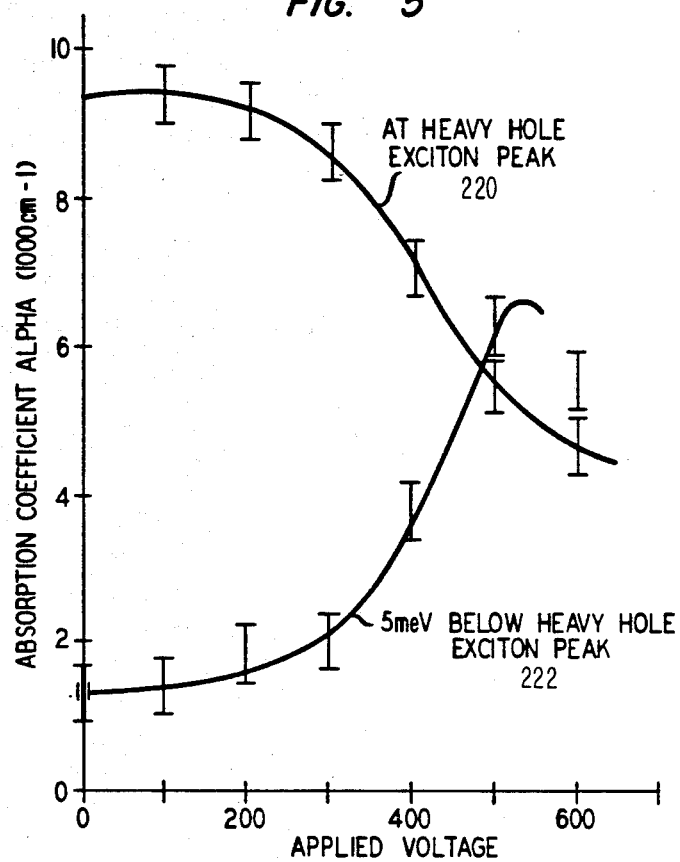
FIG. 5 is a graph showing variation in optical absorption with applied voltage for a MQW.

Referring to FIG. 5, the variations of the absorption coefficient are shown as a function of the applied potential at the heavy hole-exciton peak in curve 220, and 5 meV below in curve 222. Positive or negative changes larger than $\Delta\alpha \simeq \pm 4 \times 10^3$ cm$^{-1}$ are obtained in the absorption at given photon energies as the field is increased from 0 to $1.6 \times 10^4$ V/cm. This result compares most favorably to the case of bulk GaAs where fields up to $(5 \pm 1) \times 10^4$ V/cm are necessary to induce changes of the absorption coefficient $\Delta\alpha \simeq 2 \times 10^2$ cm$^{-1}$, as well as to the case of other III-V compounds where changes $\Delta\alpha \simeq 2 \times 10^3$ cm$^{-1}$ are obtained, but only with fields as large as $4 \times 10^5$ V/cm. Bulk GaAs is discussed more fully by Stillman et. al. in the article "Electroabsorption in GaAs and its Application to Waveguide Detectors and Modulators," published in *Applied Physics Letters*, Vol. 28, page 544, in May 1976, and other group III-V compounds are discussed more fully by Kingston in the article "Electroabsorption in GaInAsP," published in *Applied Physics Letters*, Vol. 34, page 744, in June 1979.

It is important to understand that the speed at which the absorption changes is not determined by the exciton lifetime; rather it is related to how fast the energy levels of the crystal can be shifted, which is a very fast process. The speed of a modulator based on this effect will most likely be limited by the speed at which the "static" field can be applied. We showed tht the present device produces large variations of the absorption coefficient ($\Delta\alpha \simeq \pm 4 \times 10^3$ cm$^{-1}$) for applied fields of the order of $10^4$ V/cm. This effect is usable in very highspeed optical modulation schemes because of the fast mechanisms involved and the small volume ($\lesssim 100$ μm$^3$) necessary to achieve large change of transmission.

Figure 6:
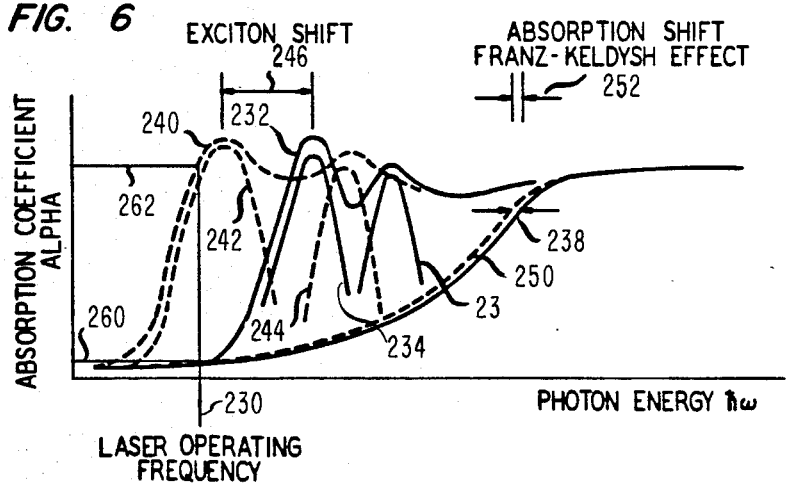
FIG. 6 is a graph showing operation of an absorption modulator.

Referring to FIG. 6, there is shown an exemplary operating frequency 230 for a laser which has its output light beam modulated by the present invention. Solid curve 232 shows the absorption coefficient ($\alpha$) plotted versus photon energy for the case that no electric potential is applied between contacts 182 and 184 as shown in FIG. 2. Curve 234, curve 236 and curve 238 show the contribution of the heavy hole, a light hole, and bandgap absorption, respectively, to the absorption coefficient curve 232.

Upon application of an electric potential between contacts 182 and 184 shown in FIG. 2, the potential results in an electric field within the MQW structure 174, and a consequent shift in the exciton absorption. Curve 240 shows, for example, a shifted absorption coefficient $\alpha$ which gives the optical absorption of the MQW structure 174 after application of electric potential between contacts 182 and 184. Curve 242 and curve 244 show the shifted heavy hole and shifted light hole exciton absorption, respectively. The shift in the heavy hole exciton peak is labeled "exciton shift" 246. The bandgap absorption is shifted a small amount through the Franz-Keldysh effect as is indicated by curve 250. The shift due to the Franz-Keldysh effect is labeled and indicated by reference numeral 252.

At laser operating frequency 230 the optical absorption coefficient has a low value shown by line 260 when zero electric potential is applied between contacts 182 and 184, and in contrast has a high value shown by line 262 upon the application of an electric potential between contacts 182 and 184. The shift in the optical absorption curve, labeled "exciton shift" 246, which occurs as a result of the application of a modest potential between contacts 182, 184, causes a very large change in the optical absorption coefficient at laser operating frequency 230, and therefore provides deep modulation of the laser beam.

As an example of the amount of modulation which can be achieved with a micron dimension modulator, the decibels (DB) of modulation can be calculated from the expressions $$\frac{I(V1)}{I(V2)} = e^{(\alpha(V2)-\alpha(V1)) \cdot T}$$

and $$DB = 10 \, \text{Log}_{10} \frac{I(V1)}{I(V2)}$$

where I(V1) and $\alpha$(V1) are the intensity and absorption coefficient at voltage V1, I(V2) and $\alpha$(V2) are the intensity and absorption coefficient at voltage V2, and T is the length of the optical path through the MQW. The example presented above showed a $\Delta\alpha$, where $$\Delta\alpha = \alpha(V2) - \alpha(V1)$$

of approximately $4 \cdot 10^3$ cm$^{-1}$ for applied voltages of less than 600 volts. Using equation (2) with various thicknesses gives the modulation shown in Table 1.

TABLE 1

| Thickness T Microns | Modulation DB |
|---|---|
| 10 | 17 |
| 15 | 26 |
| 20 | 35 |

Thus the "exciton shift" 246 provides excellent deep modulation of a laser beam with only micron dimension optical path length.

Figure 7:
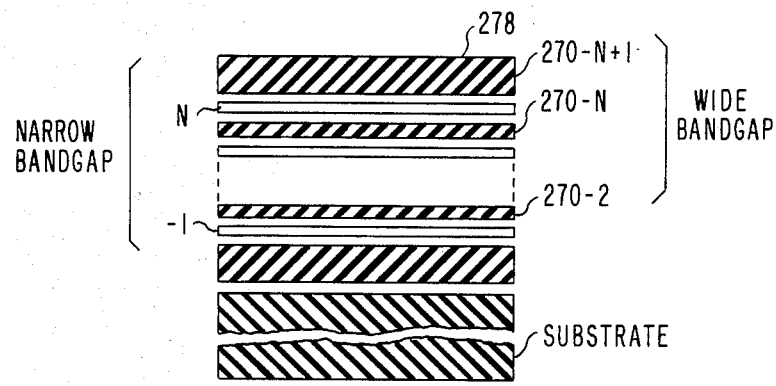
FIG. 7 is a cross section of a MQW structure.

An MQW structure, as designated in FIG. 1 by reference numeral 120 and in FIG. 2 by reference numeral 174, is a semiconductor multiple layer heterostructure. An MQW is made of alternate layers of wide bandgap material and narrow bandgap semiconductor material. FIG. 7 gives a cross-sectional view of a typical MQW structure. An exemplary embodiment of an MQW uses $Al_xGa_{1-x}As$ as the wide bandgap material and GaAs as the narrow bandgap semiconductor material.

Layers of narrow bandgap GaAs 268-1 to 268-N are alternated with layers of wide bandgap $Al_xGa_{1-x}As$ 270-1 to 270-N+1. Convenient choices for the dimensions of the structures in an MQW are, for the thicknesses of the GaAs 268-1 to 268-N layers 0.01 micron, for the thickness of the $Al_xGa_{1-x}As$ 270-2 to 270-N layers 0.01 micron, and for the thickness of the GaAs substrate 274 approximately 100 microns. The side dimensions of the substrate 274 may be chosen conveniently as approximately 1 to 5 millimeters. The MQW structure then has layer planes of GaAs 268-1 to 268-N whose length and width are approximately 1 to 5 millimeters and whose thickness is approximately 0.01 microns. Also the alternate layers of $Al_xGa_{1-x}As$ 270-2 through 270-N have the same ratio of length and width to thickness, that is, 1 to 5 millimeters in length and width and approximately 0.01 microns in thickness. Thus, the MQW structure comprises essentially plane layers of GaAs 268-1 to 268-N interleaved with plane layers of $Al_xGa_{1-x}As$ 270-1 to 270-N+1. The alternate layers of GaAs and $Al_xGa_{1-x}As$ may be deposited using, for example, molecular beam epitaxy using methods as, for example, taught by Dingle et. al. in U.S. Pat. Nos. 3,982,207, 4,205,329 and 4,261,771. Epitaxial growth of heterostructures is further described in the reference book by Casey and Panish, "Heterostructure Lasers Part B: Materials and Operating Characteristics", at Chap. 6, pp. 71-155, and molecular beam epitaxy is particularly discussed at pp. 132-144, Academic Press, New York, 1978.

Further details of an exemplary design for an MQW multiple layer heterostructure are also given in FIG. 7. There is shown in FIG. 7 capping layers 270-1 and 270-N+1. The capping layers 270-1 and 270-N+1 are the first and last wide bandgap layers, and they are made thicker than the layers 270-2 to 270-N which only separate layers of narrow bandgap material. An internal capping layer 270-1 may be epitaxially grown on substrate 274 in order, for example, to cover over any imperfections in the upper surface 278 of substrate 274. An external capping layer 270-N+1 may serve to protect the underlying thinner layers from mechanical injury. Further, the upper surface 280 of external capping layer 270-N+1 may be shaped or treated to serve as a partially reflecting mirror, or surface 280 may serve to attach the multiple layer heterostructure to an external device (not shown), or surface 280 may serve as the side of an optical waveguide used to direct a beam of light to propagate substantially parallel to the layer planes 268-1 to 268-N and 270-1 to 270-N+1. Surface 280 and external capping layer 270-N+1, or internal capping layer 270-1, may serve additional purposes which will be apparent to those skilled in the art of optical devices. Capping layers 270-1 and 270-N+1 are normally made from the wide bandgap material which forms the charge barrier layers, and so additionally serve the function of preventing charges from leaking out of the narrow bandgap charge carrier material.

Figure 9:
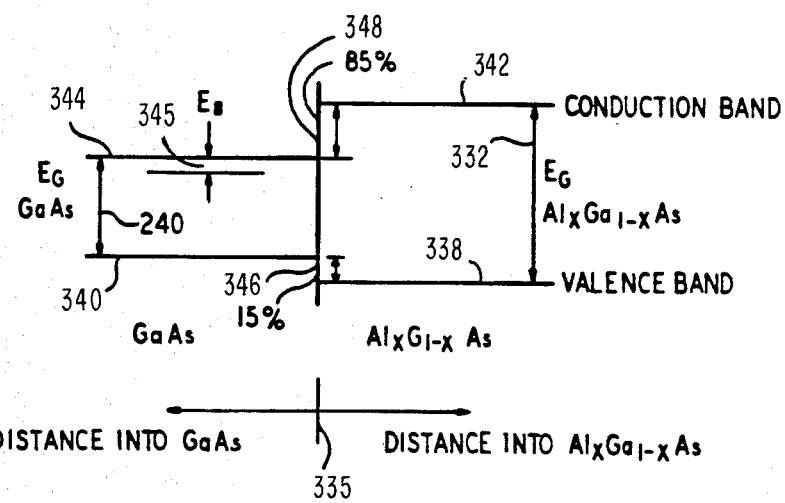
FIG. 9 is an energy band diagram for a heterojunction.

The narrow bandgap layers 268-1 to 268-N are charge charrier layers and each layer forms a quantum well. The width of the quantum well is determined by the thickness of the narrow bandgap material. The barrier heights for the quantum well are determined by the differences between the conduction bands and between the valence bands of the narrow bandgap material 268-1 to 268-N and the wide bandgap material 270-1 to 270-N+1. The barrier heights at the junction between epitaxially grown narrow bandgap and wide bandgap materials are shown in FIG. 9 for the $GaAs/Al_xGa_{1-x}As$ case. In FIG. 9 both the conduction band barrier and the valence band barrier are shown.

Figure 10:
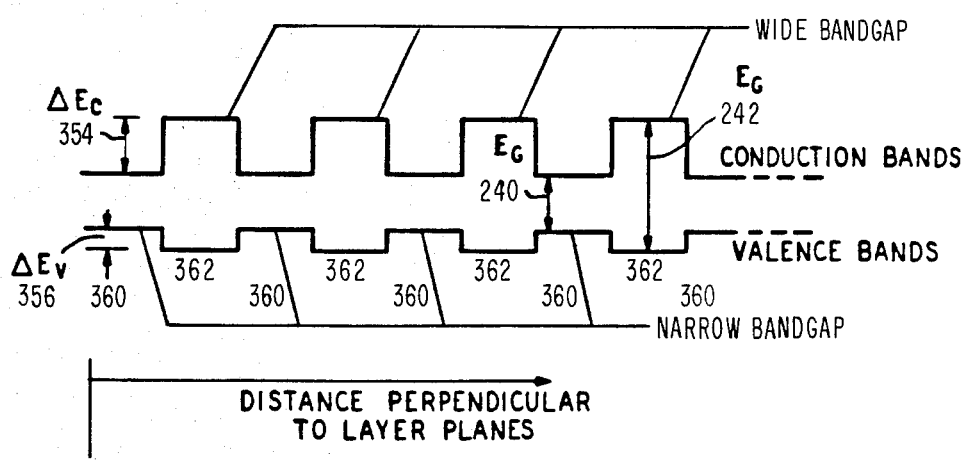
FIG. 10 is an energy band diagram for a MQW structure.

The wide bandgap material used for layers 270-1 to 270-N+1 need not be a semiconductor. The layers must be epitaxially grown upon the substrate 274, and one upon the other. The charge carriers produced by photon absorption within the layers of narrow bandgap material 268-1 to 268-N then may propagate throughout the entire epitaxially grown crystal with their motion limited only by the potential barriers which occur at the boundaries of narrow bandgap material and wide bandgap material, as is shown in FIG. 9 and FIG. 10 for the $GaAs/Al_xGa_{1-x}As$ case.

Figure 8:
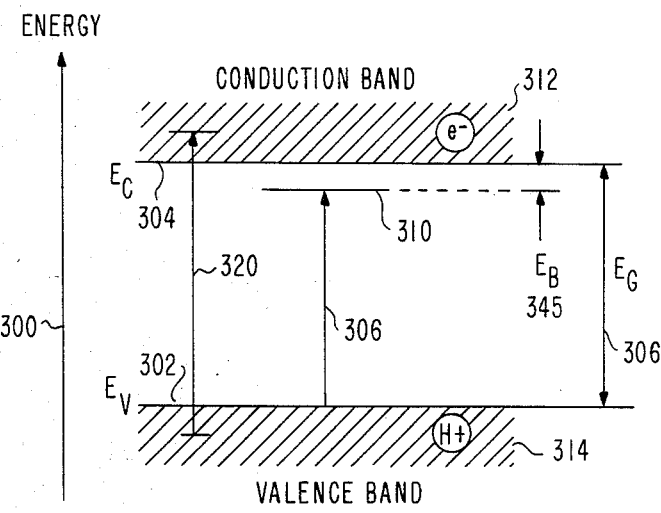
FIG. 8 is an energy band diagram for a semiconductor.

Referring to FIG. 8, the band structure of GaAs is shown in a simplified diagram. Reference to the GaAs band structure as shown in FIG. 8 provides insight into exciton absorption in an MQW structure. Energy is plotted along the vertical axis 300. The valence band $E_v$ 302 and the conduction band $E_c$ 304 are shown along with the energy gap $E_G$ 306. An exciton level 310 is shown with a binding energy $E_B$ 312 measured from the conduction band 304.

A photon absorption transition 306 from the valence band 302 to the exciton level 310 is shown. Transition 306 represents an exciton creation transition, and such transistions are thought to be the cause of resonant absorption peaks 200A and 210A as shown in FIG. 3. After the exciton level 310 is formed as a result of photon absorption, the exciton may break apart and form both a conduction band electron 312 and a valence band hole 314. The exciton is thought to break apart as a result of ionization by a lattice vibration phonon which supplies the necessary energy.

An interband photon absorption transition 320 in which a conduction band electron 312 and a valence band hole 314 are formed as a result of photon absorption is shown. Interband photon transitions 320 are thought to account for the bandgap absorption as indicated by reference numeral 238 in FIG. 6. The interband photon absorption transition 320 is a direct transition because of the band structure of GaAs.

Referring to FIG. 9, the bandgap 330 of GaAs and the bandgap 332 of $Al_xGa_{1-x}As$ are shown for an epitaxially grown junction 335. Such junctions occur between the layers of epitaxially grown alternate layers of GaAs and $Al_xGa_{1-x}As$ as shown in FIGS. 1, 2, and 7. The valence band edge 338 of $Al_xGa_{1-x}As$ is believed to be lower in energy than the valence band edge 340 of GaAs. The conduction band edge 342 of $Al_xGa_{1-x}As$ is believed to be higher in energy than the conduction band edge 344 of GaAs. The total difference between the two gaps, of GaAs and $Al_xGa_{1-x}As$, is believed to be distributed as approximately 15 percent 346 of the difference appears at a lowered valence band edge 338 of $Al_xGa_{1-x}As$, and approximately 85 percent 348 of the difference appears as an increase in the conduction band edge 342 of $Al_xGa_{1-x}As$, relative to GaAs. The exciton binding energy $E_B$ for GaAs is designated by reference numeral 345 in FIGS. 8 and 9, for the case in which the GaAs layer is substantially thicker than 1000 Angstroms.

Referring to FIG. 10, the potentials seen by both a conduction band electron and by a valence band hole within a MQW structure are shown. The conduction band electron energy barrier $\Delta E_C$ 354 is shown. The valence band hole energy barrier $\Delta E_V$ 356 is shown. Conduction electrons within a narrow bandgap layer 360 are trapped in a potential well with sides of height $\Delta E_C$ 354. Correspondingly, valence band holes within a narrow bandgap layer 360 are trapped by the energy barrier $\Delta E_V$ 356.

A conduction band electron or a valence band hole may be produced within the narrow bandgap layers 360. Alternatively, if the electron and hole are produced within the wide bandgap layers 362, they will experience potentials due to $\Delta E_V$ and $\Delta E_C$ which will drive them into the narrow bandgap layers 360 where they will be trapped by the potential barriers $\Delta E_V$ and $\Delta E_C$. In an exemplary embodiment in which the narrow bandgap material is GaAs and the wide bandgap material is $Al_xGa_{1-x}As$, the magnitude of both $\Delta E_V$ and $\Delta E_C$ depends upon the mole fraction x of Al in the wide bandgap layers.

The energy levels of electrons and holes trapped within the narrow bandgap layers 360 are shifted relative to their locations in bulk material because of quantum confinement effects arising from the thinness of the narrow bandgap layers 360. A thickness of 1000 Angstroms or less can cause appreciable shift in the allowed energy levels of a semiconductor layer. Also the electrons and holes interact to form exciton pairs. The exciton pairs occupy energy levels which are shifted from the single particle energy levels. All of these energy levels are affected by an electric field applied to the narrow bandgap layers 360. Referring to FIG. 11, the effective optical thickness of the MQW structure mounted as shown in FIG. 2 is shown plotted versus the intensity of incident light beam 192. The incident light beam 192 is adjusted to coincide with peak 200A in the optical absorption curve shown in FIG. 3. The intensity of light beam 192 was varied. The effective optical thickness of the sample measures the total attenuation of the light beam as it traverses the sample. Curve 370 shows the effective optical thickness of a bulk sample of GaAs. Curve 372 shows the effective optical thickness of the MQW device. The effective average intensity of light beam 192 is plotted along the lower margin 374 of FIG. 11 and is shown to vary from 0 to approximately 50,000 Watts/cm². The total incident power in beam 119 is plotted along the upper margin 376 of FIG. 11 and is shown to vary from 0.01 to approximately 50 milliwatts. A comparison of the effective optical thickness of bulk GaAs and a $GaAs/Al_xGa_{1-x}As$ MQW device at an incident light power of 0.1 milliwatts is shown by lines 380, 382, 384. The effective optical thickness of the bulk GaAs shown in curve 370 is shown to decrease from a value of approximately 2 to a value of approximately 1.9 at an incident power of approximately 0.1 milliwatts, an approximate change in effective optical thickness of (2.0-1.9)/2=5%. In contrast, the effective optical thickness of the MQW device is seen to vary from approximately 0.75 to approximately 0.63 as the incident power varies from zero to 0.1 milliwatts, for a percentage change of approximately (0.75-0.63)/0.75=16%. The decrease in effective optical thickness with increasing beam intensity is attributed to saturation of the optical absorption of the material, and is commonly referred to as a nonlinear absorption.

Referring to FIG. 12, an example of the variation of optical absorption 390 and index of refraction 392 with photon energy is shown as the two are related by the Kramers-Kronig relationship using a Lorentzian absorption lineshape. The curves of optical absorption 390 and index of refraction 392 illustrate generally the variation of these quantities for exciton absorption over a photon energy range in the vicinity of the bandgap. The curves shown in FIG. 12 illustrate the relationship between optical absorption as shown in FIG. 3 for an MQW structure and the corresponding index of refraction, as that relationship is given by the Kramers-Kronig relationship using a Lorentzian absorption lineshape.

Curve 390-A represents a large optical resonant absorption for a low incident light intensity, and a corresponding index of refraction is shown in curve 392-A. A smaller resonant absorption is represented by curve 390-B for a higher incident light intensity and the correspondingly smaller index of refraction is repesented by curve 392-B. A further smaller resonant absorption is represented by curve 390-C for a still higher incident light intensity and the correspondingly smaller index of refraction is represented by curve 390-C.

For a single exciton resonance the Kramers-Kronig model illustrated in FIG. 12 shows that for photon energy below the resonant energy 395 the index of refraction decreases with increasing light intensity, while for photon energies above the resonant energy 395 the index of refraction increases with increasing incident light intensity.

For a multiple quantum well, the variation of index of refraction with light intensity depends upon the interaction of at least one and possibly several exciton resonances with the processes leading to the background index of refraction. These interactions involve quantum interference effects which further complicate the detailed variation of the index of refraction with both light intensity and photon energy. For example, the $GaAs/Al_xGa_{1-x}As$ MQW, whose measured optical absorption coefficient is shown in FIG. 3, is dominated by two resolvable exciton absorption peaks superimposed upon an interband transition background. The interaction of those absorption processes complicates the variation of index of refraction beyond the simple predictions of the one peak model using the Kramers-Kronig relationship. However, the model makes a useful connection between the measured optical absorption and the index of refraction for the practice of embodiments of the invention which depend upon a variation of the index of refraction with incident light intensity, or applied electric field.

FIG. 13 shows an alternative attachment of electrical contacts to a MQW structure 403. Contacts 400, 401 provide an electric field substantially parallel with the planes 405 of MQW 403.

FIG. 14 shows a top view of MQW 410. Electrical contacts 412 and 414 may, for example, be deposited upon the upper surface (shown in top view but not indicated by reference numeral) of MQW 410. Contacts 412, 414 provide a substantially uniform electric field between end 416 and end 418 which penetrates MQW 410 and provides an electric field substantially parallel to the layer planes of MQW 410.

Referring to FIG. 15, there is shown an alternative arrangement of electrical contacts 420, 422 to MQW structure 424. Contacts 420, 422 may be made, for example, by ion implantation of an MQW. Selective ion implantation produces conductive regions in a semiconductor which result in electrical contacts 420, 422. Also, diffusion may be used to make doped contacts.

Figure 16:
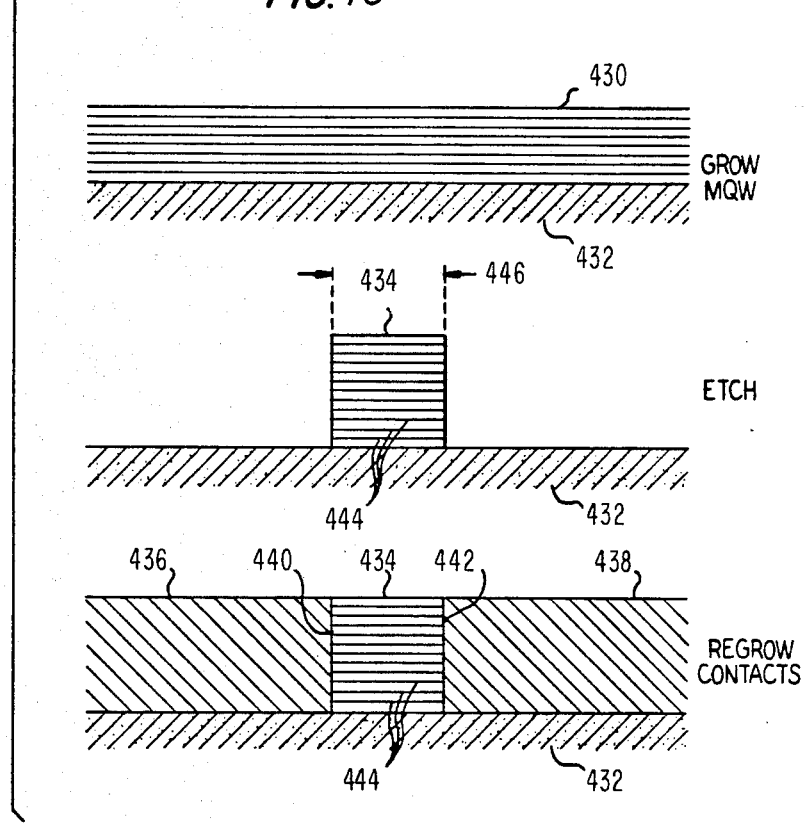
FIG. 16 is a cross-sectional drawing showing an alternate method of attaching contacts to a MQW structure.

Referring to FIG. 16, there is shown an alternative exemplary method of making electrical contacts to the layer planes of an MQW. As a first step, an MQW 430 is grown epitaxially upon a substrate 432. As a second step, a mesa 434 of MQW material is made by selectively etching away MQW material. As a third step, contacts 436, 438 are regrown on substrate 432 so as to electrically contact the edges 440, 442 of layer planes 444 of the mesa 434 of MQW material. A potential applied between contacts 436, 438 produces an electric field within mesa 434 which is substantially parallel with the MQW layer planes 444.

The narrow spacing, 446, provides a small volume modulator. For example, the active region could be 1 micron square, and the thickness could, for example, be 20 microns to provide a modulation of 35 DB as given in TABLE 1, for a total active volume of 20 cubic microns. Such a small volume provides a small capacitance and operates satisfactorily in the multiple gigahertz frequency range.

Materials other than the GaAs/AlGaAs system are useful in practicing the invention. A MQW may be made in which the narrow bandgap material is $Al_yGa_{1-y}As$ and the wide bandgap material is $Al_xGa_{1-x}As$. The bandgap of the material is larger as the fraction of Al in the material is larger, and so the wider bandgap mole fraction x must be larger than the narrow bandgap mole fraction y.

The invention uses a superlattice in which the conduction band of the narrow bandgap layer is below the conduction band of the wide bandgap layer, and the valence band of the narrow bandgap layer is above the valence band of the wider bandgap layer, and this type of superlattice band structure is named a Type 1 superlattice. The Type 1 superlattice is distinguished from a Type 2 superlattice in which both the conduction band and valence band of one of the materials are below the corresponding conduction and valence bands of the other material. A Type 2 superlattice device is disclosed by Chang et. al. in U.S. Pat. No. 4,208,667 issued June 17, 1980 and entitled "Controlled Absorption in Heterojunction Structures".

Materials which are believed to exhibit the Type 1 superlattice band structure and are suitable for making an MQW structure of the present invention include InGaAs, InGaAlAs, InGaAsP, and also HgCdTe. These materials are useful for application in the 1.5 micron to 1.3 micron wavelength range.

Lattice-matched growth of these materials and their band structure is discussed more fully in the books by Casey and Panish entitled "Heterostructure Lasers, Part A", and "Heterostructure Lasers, Part B", Academic Press, New York, 1978. Also HgCdTe is believed to exhibit the type 1 superlattice band structure and is therefore suitable for making an MQW of the present invention.

In a structure using InGaAs, the narrow bandgap layers use InGaAs and the wide bandgap layers use InP. These materials are lattice-matched and so are suitable for epitaxial growth as a multiple quantum well device.

In a structure using InGaAlAs as the narrow bandgap material, the wider bandgap material may be InP or may be other compositions of InGaAlAs which are chosen to have a wider bandgap. Such a choice is possible because the bandgap of the material can be varied by varying the composition, while maintaining lattice-matched crystal growth.

In a structure using InGaAsP as the narrow bandgap material, the wider bandgap material may be selected from InP or may be another composition of InGaAsP which is lattice-matched for crystal growth.

In a structure using HgCdTe as the narrow bandgap material, the wider bandgap material may be made using HgCdTe of a different composition of CdTe and therefore wider bandgap.

Additional materials which are believed to exhibit type 1 superlattice band structure include GaSb, AlGaSb, Si and Ge.

Figure 17:
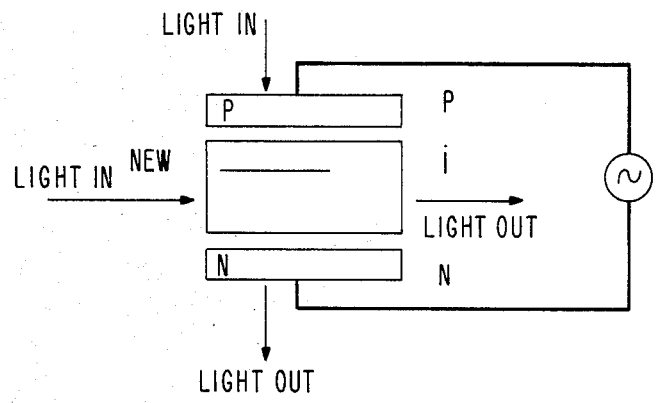
FIG. 17 is a cross-sectional Figure showing a PIN semiconductor structure for applying an electric field to a MQW.

Turning now to FIG. 17, there is shown an MQW used as the intrinsic, or I, layer of a PIN semiconductor diode structure. An electric field may be advantageously applied to the MQW by reverse biasing the PIN diode. The PIN diode structure is particularly suitable for applying the electric field perpendicular to the layer planes of the MQW. Advantages gained from the use of the PIN structure to apply an electric field to the MQW are that the diode is operated in reverse bias, and this condition gives a high resistance to current flow through the MQW. Also the device may be made small in lateral area in order to minimize the capacitance.

Figure 18:
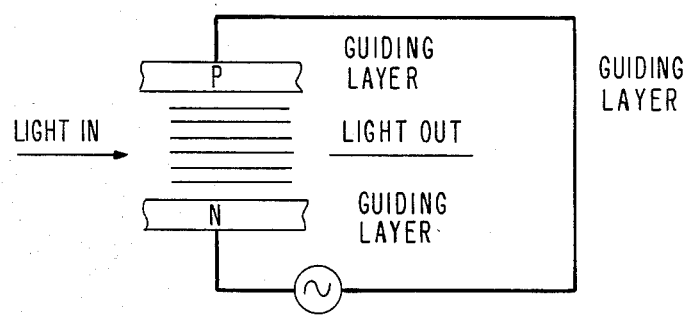
FIG. 18 is an alternate arrangement of a PIN structure for applying an electric field to a MQW structure.

FIG. 18 shows an alternate PIN diode structure for conveniently propagating the light in the direction parallel to the MQW layers. The MQW may have only one narrow bandgap layer sandwiched between wide bandgap layers to form only one quantum well. Or the MQW may have several narrow bandgap layers in order to provide a stronger interaction between the light and the optical properties of the quantum wells, such as absorption, index of refraction, birefringence, and other polarization properties. Lateral confinement of the light can be achieved by etching a ridge or by other means.

Figure 19:
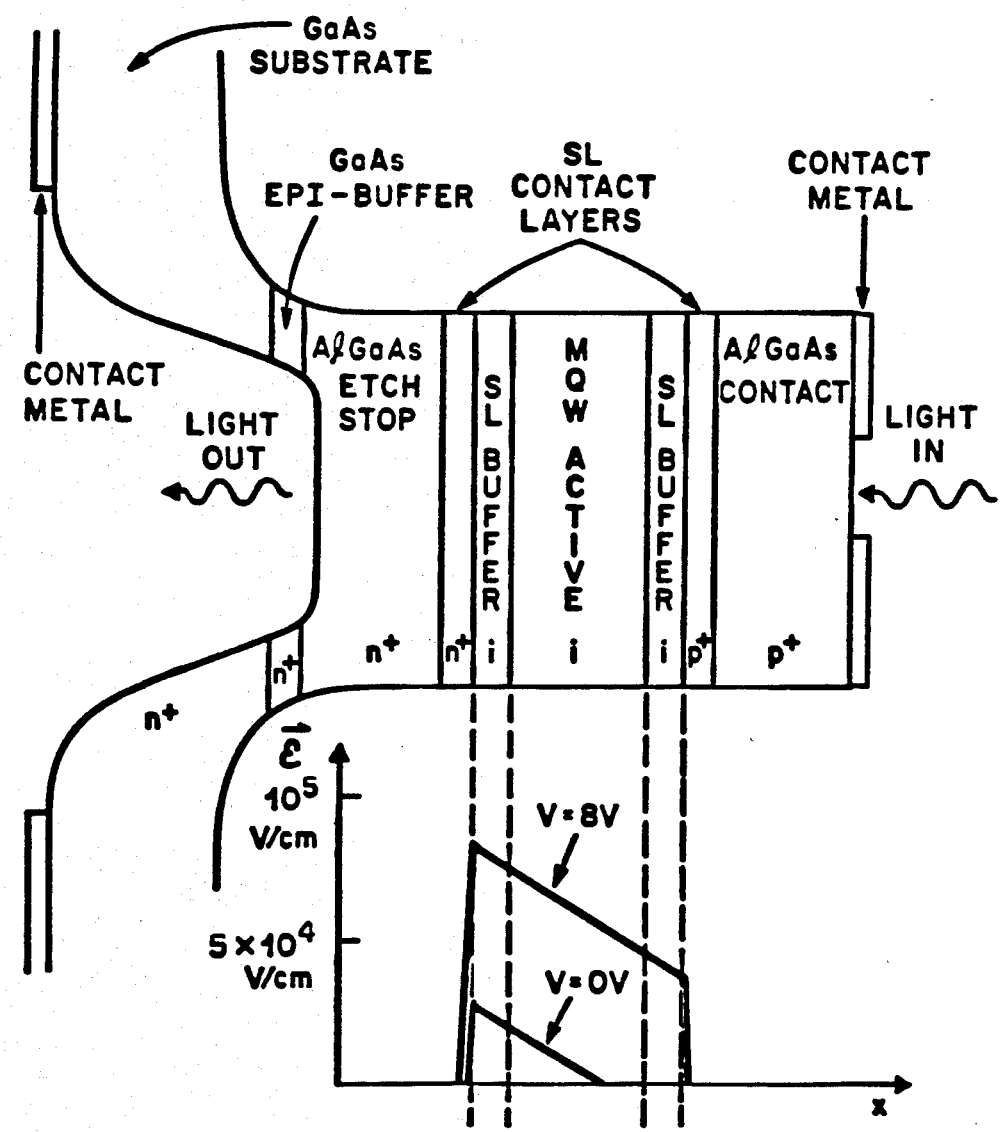
FIG. 19 is an alternate PIN structure for applying an electric field to a MQW.

Turning to FIG. 19, there is shown an exemplary embodiment of a PIN diode structure used to apply an electric field perpendicular to the layer plane of an MQW. The sample was grown on a Si doped [100] GaAs substrate. The undoped optically active layer contained 50 GaAs wells each 95 Angstroms thick and was surrounded by undoped buffer layers and doped contact layers. This structure creates a PIN diode which was operated in reverse bias mode. A buffer and first contact layers were also made of a superlattice of alternating layers of GaAlAs and GaAs. Introducing the thin layers of GaAs into the nominally undoped buffer regions was found to reduce the background doping level by more than an order of magnitude. This reduction of background doping level reduces the field inhomogeneity across the active region and reduces the drive voltage of the device. The device was defined laterally by an etched mesa 600 microns in diameter. A small hole was etched through the opaque substrate by a selective chemical etch. The capacitance of the device was 20 pF. The device was made fairly large for ease of fabrication, but a smaller device will advantageously have smaller capacitance.

The lower portion of FIG. 19 shows the internal electric field in the various layers at two different applied voltages as calculated within the depletion approximation with a p-type background doping level of $2 \times 10^{15}$ cm$^{-3}$ in the intrinsic layers. The active layer can be switched from a low field to a high field of approximately $6 \times 10^4$ V/cm by the application of 8 volts. Because the device is operated as a reverse biased device, its resistance is high and its capacitance is low, which are desirable electrical properties. The heavily doped contact layers can easily be metallized and contacted.

Figure 20:
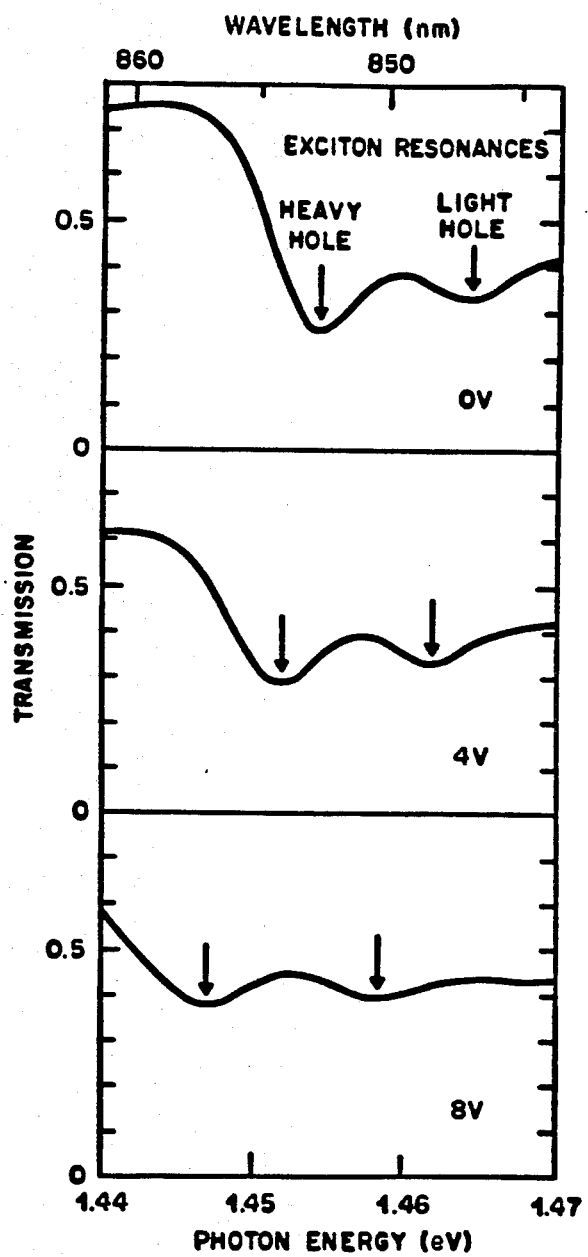
FIG. 20 is a graph giving optical transmission versus photon energy for various voltages applied to a MQW using a PIN structure.

Turning to FIG. 20, there is shown the optical transmission of an exemplary embodiment of the invention as shown in FIG. 19. The transmission at 0 volts shows the usual exciton peaks. Between 0 volts and 8 volts applied there is almost a factor of 2 reduction in transmission at a photon energy of 1.446 eV (857 nm). Greater modulation depth is possible with a thicker sample. The dynamical optical response was determined by bridging the PIN diode structure with a 50 ohm resistor and driving it with a pulse generator with a rise time of 1.8 nanosecond. The optical output was detected with a Si avalanche photodiode of roughly 1 nanosecond rise time. The observed 10% of 90% rise time was 2.8 nanoseconds. The calculated RC rise time of the device when driven by a 50 ohm load is 2.2 nanoseconds. The optical photon energy was 1.454 eV (853 nm). Thus modulation occurred with a rise time limited by the capacitance of the device.

Figure 21:
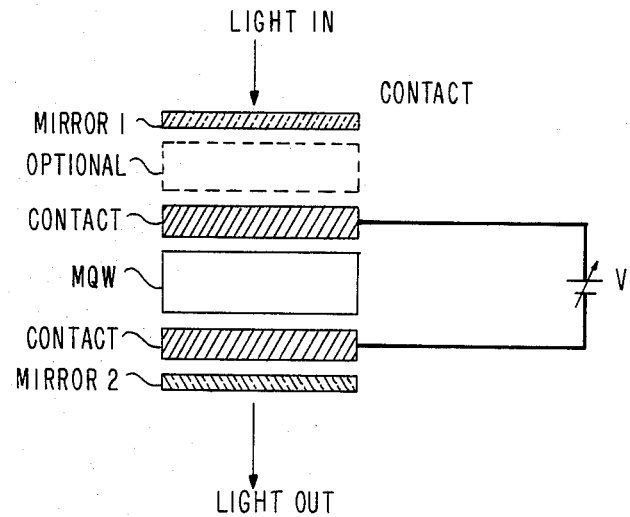
FIG. 21 is a cross section showing a controlled Fabry-Perot cavity.
Figure 22:
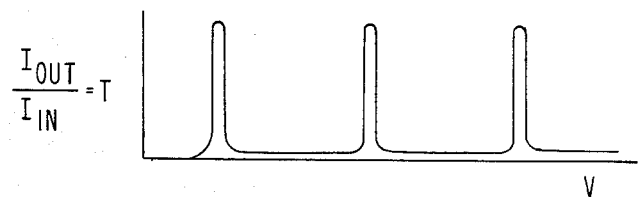
FIG. 22 is a graph giving the optical transmission of a controlled Fabry-Perot cavity versus applied voltage.

Turning now to FIG. 21, there is shown an illustrative embodiment of an electrically tuned Fabry-Perot cavity. The Fabry-Perot cavity is formed by two substantially parallel mirrors which are partially transparent. The MQW is placed between the two mirrors and therefore within the Fabry-Perot cavity. The MQW has an adjustable electric field applied perpendicular to the layer planes. The optical transmission of the Fabry-Perot cavity for light incident substantially perpendicular to the mirrors is high when the optical path length between the mirrors is an integral number of one-half wavelengths of the light. The index of refraction of the MQW, and hence the optical path length within the Fabry-Perot cavity can be changed by changing the voltage applied to the MQW. FIG. 22 is an illustrative graph of the optical transmission of the Fabry-Perot cavity shown in FIG. 21. The optical transmission is plotted versus the voltage applied to the MQW. The index of refraction of the MQW varies as the voltage varies, and so at values of the voltage for which the optical path length within the Fabry-Perot cavity is an integral number of one-half wavelengths, the optical transmission is high, and at other values of the voltage the transmission is low.

A lasing gain medium may be optionally included within the Fabry-Perot cavity along with the voltage-controlled MQW. The frequency at which the gain medium lases may be selected by a choice of the optical path length within the Fabry-Perot cavity, and so the frequency of lasing of the gain medium may be selected by adjustment of the voltage applied to the MQW. Choosing the voltage applied to the MQW determines the index of refraction of the MQW, the index of refraction determines the optical path length within the Fabry-Perot cavity, and the lasing frequency will be limited to those frequencies for which a one-half integral number of wavelengths exist within the Fabry-Perot cavity. Lasing occurs at those frequencies for which the output spectrum of the lasing medium matches the frequencies at which a one-half integral number of wavelengths can exist within the Fabry-Perot cavity.

Figure 23:
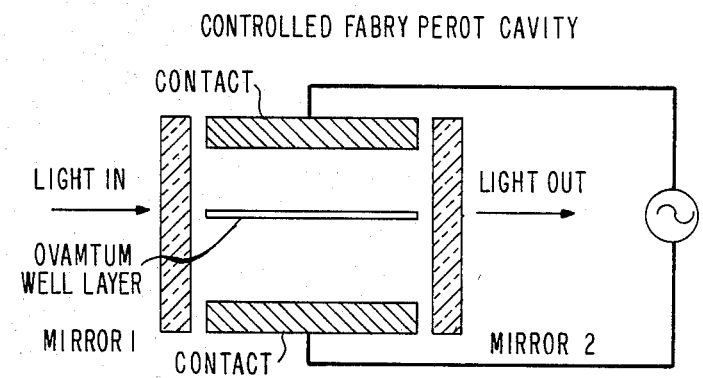
FIG. 23 is a cross sectional view showing a controlled Fabry-Perot cavity.

Turning now to FIG. 23, a cross sectional view of a controlled Fabry-Perot cavity is shown. Light propagates parallel to the layers of the MQW. Mirrors in which the plane of the reflective surface lies substantially perpendicular to the propagation direction of the light are shown and define the Fabry-Perot cavity. Only one exemplary quantum well is shown because the optical path length is long when the light beam propagates parallel to the layers, and consequently sufficient optical interaction is achieved with only a few quantum wells.

Figure 24:
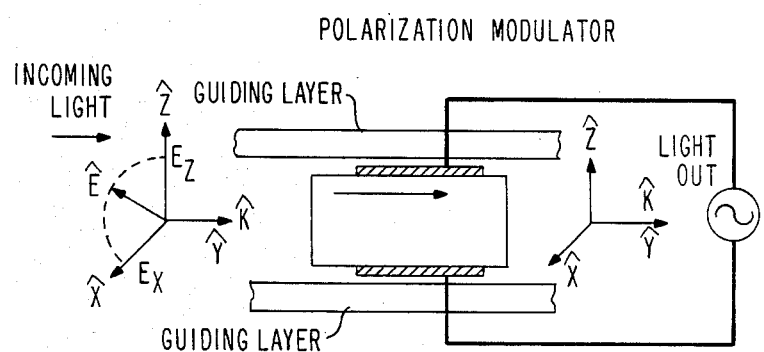
FIG. 24 is a cross sectional view showing a polarization modulator.

FIG. 24 shows a cross-sectional view of a polarization modulator. Light propagates parallel to the layer planes of the MQW, and is guided by the guiding layers. The directions of propagation of the incoming light is indicated by the direction k. The polarization of the incoming light is described by reference to the x,y,z coordinate axis in which the y axis is shown to lie along the direction of propagation of the incoming light, that is, the direction k coincides with the y axis. The polarization of the incoming lightwave is defined by the components of the electric field of the incoming light as they are resolved along the x and z axes. $E_x$ is the component of the lightwave electric field resolved along the x axis and lies parallel to the layer planes of the MQW. $E_z$ is the component of the lightwave electric field resolved along the z axis and lies perpendicular to the layer planes of the MQW. The optical transmission of the MQW along the direction parallel to the layer planes, which is along the y axis, is different for the two polarization components $E_x$ and $E_z$. This difference in transmission is a birefringence of the MQW.

The birefringence of the MQW may be varied by application of an electric field to the MQW. For example, an electric field may be applied to the MQW in a direction substantially perpendicular to the layer planes. Alternatively the electric field may be applied parallel to the layer planes. For a parallel application of the electric field to the layers of the MQW there are two possibilities, the first being parallel to the propagation direction of the light, that is along the y axis. The second possibility is perpendicular to the propagation direction of the light, that is along the x axis. Each of these possible applications of an electric field may be used to cause variation in the polarization of the outgoing light. A downstream polarization filter (not shown) permits intensity modulation of the light as it emerges from the filter.

The input light may be tuned to a frequency which optimizes the modification of absorption property of the MQW by the applied electric field.

In FIG. 6, the laser operating frequency 230 indicates an exemplary adjustment of the laser frequency for operation of a device as an absorption modulator. We turn now to optimization of the MQW device as a modulator of optical path lengths. The laser may be operated at a frequency 230A, which is well below the energy of the large absorption as modified by the electric field. The influence of the electric field on the index of refraction extends below the absorption peak. Because the index of refraction effect extends below the absorption peak it is possible to tune the low frequency much as shown by 230A in FIG. 6 in order to optimize the apparatus to modify the optical path lengths through the MQW. The light frequency for optimum operation of the device will depend upon the polarization of the incident light.

The optical absorption and the index of refraction may be saturated by increasing the intensity of the input light. The saturation may be influenced by application of an electric field to the MQW. For example, a bistable optical device may be caused by application of an electric field to become not bistable. Also the operating characteristics of a nonlinear optical device may be changed by application of an electric field.

Figure 25:
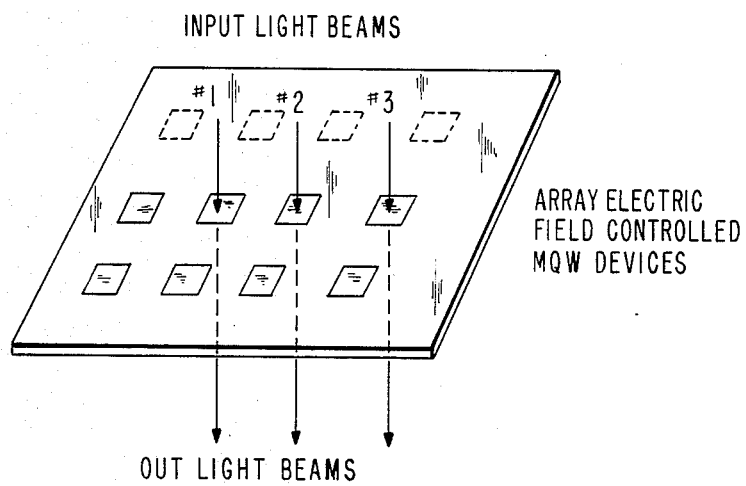
FIG. 25 shows an array of electric field controlled MQW devices.

In FIG. 25 an array of electric field controlled MQW devices is shown. An array of electric field controlled type of MQW devices may be grown on a single substrate. These MQW devices may form a logical array of optical switching elements. The logic of the element may be modified by application of electric fields to the individual elements. A different electric field may be applied to each MQW device. An array of MQW devices which are individually controlled by electric fields is a programmed logical array.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A semiconductor apparatus including:
   modulator means jointly responsive to an applied electric field and a first optical signal for translating the first optical signal into a second optical signal, the second optical signal being an amplitude modulated version of the first optical signal, the first and second optical signals being at substantially equal wavelengths, and
   means for applying the electric field to said modulator means in order to vary an optical absorption coefficient and an index of refraction therefor,
   the semiconductor apparatus being characterized in that the modulator means includes
   a multiple layer heterostructure having first and second material layers having first and second bandgaps, respectively, and a semiconductor layer having a third bandgap and being positioned between said material layers, the bottom of the conduction band of said semiconductor layer being below the bottom of the conduction bands of said material layers, and the top of the valence band of said semiconductor layer being above the tops of the valence bands of said material layers, the thickness of said semiconductor layer being sufficient for carrier confinement effects within said semiconductor layer to influence the optical properties of said multiple layer heterostructure.

2. The apparatus as defined in claim 1 wherein said thickness of said semiconductor layer is not greater than 1000 Angstroms.

3. The apparatus as defined in claim 1 wherein said means for applying the electric field comprises:
   a p doped semiconductor layer contacting the first material layer and
   an n doped semiconductor layer contacting the second material layer.

4. The apparatus as defined in claim 1 wherein said means for applying the electric field is arranged to apply said electric field substantially perpendicular to said layers.

5. The apparatus as defined in claim 1 wherein said means for applying the electric field is arranged to apply said electric field substantially parallel to said layers.

6. The apparatus as defined in claim 1 wherein said means for applying the electric field comprises metallic contacts to the first and second material layers.

7. The apparatus as defined in claim 1 wherein said means for applying the electric field comprises a source of time varying voltage which varies said optical absorption coefficient and said index of refraction of the multiple layer heterostructure.

8. The apparatus as defined in claim 1 further comprising:
   first and second mirrors forming a Fabry-Perot cavity therebetween and said multiple layer heterostructure being located between said mirrors.

9. The apparatus as defined in claim 8 further comprising:
   a lasing medium located between said mirrors in such a way that the light emitted by said lasing medium passes through said multiple layer heterostructure.

10. The apparatus as defined in claim 9 wherein the intensity of said light emitted by said lasing medium is modulated.

11. The apparatus as defined in claim 9 wherein the frequency of said light emitted by said lasing medium is modulated.

12. The apparatus as defined in claim 1 further comprising:
    means for illuminating said multiple layer heterostructure with light, and
    means for varying the intensity of said light in order to change said optical absorption coefficient and said index of refraction of said multiple layer heterostructure.

13. The apparatus as defined in claim 12 wherein said optical absorption coefficient and said index of refraction vary in joint response to the intensity of said light and said electric field.

14. The apparatus as defined in claim 1 wherein the modulator means includes a plurality of said multiple layer heterostructures.

15. The apparatus as defined in claim 1 wherein said semiconductor layer is made of GaAs.

16. The apparatus as defined in claim 1 wherein said semiconductor layer is made of AlGaAs.

17. The apparatus as defined in claim 1 wherein said semiconductor layer is made of InGaAs.

18. The apparatus as defined in claim 1 wherein said semiconductor layer is made of InGaAlAs.

19. The apparatus as defined in claim 1 wherein said semiconductor layer is made of InGaAsP.

20. The apparatus as defined in claim 1 wherein said semiconductor layer is made of HgCdTe.

21. The apparatus as defined in claim 1 wherein at least one of said first and second material layer is a multiple layer heterostructure.

22. The apparatus as defined in claim 1 wherein said semiconductor layer is made of Si.

23. The apparatus as defined in claim 1 wherein said semiconductor layer is made of Ge.

24. The apparatus as defined in claim 1 wherein said semiconductor layer is made of GaSb.

25. The apparatus as defined in claim 1 wherein said semiconductor layer is made of AlGaSb.

* * * * *